United States Patent [19]

Porter

[11] 4,355,366
[45] Oct. 19, 1982

[54] CIRCUITRY FOR MINIMIZING AUTO-CORRELATION AND BIAS IN A RANDOM NUMBER GENERATOR

[75] Inventor: Sigmund N. Porter, Solana Beach, Calif.

[73] Assignee: NCR Corporation, Dayton, Ohio

[21] Appl. No.: 210,989

[22] Filed: Nov. 28, 1980

[51] Int. Cl.³ .............................................. H03K 3/84
[52] U.S. Cl. ...................................... 364/717; 331/78
[58] Field of Search ......................... 364/717; 331/78; 178/22.15

[56] References Cited

U.S. PATENT DOCUMENTS 3,691,472  9/1972  Bohman .......................... 331/78 X
3,790,768  2/1974  Chevalier et al. .................. 364/717
4,115,657  9/1978  Morgan .......................... 364/717 X

*Primary Examiner*—David H. Malzahn
*Attorney, Agent, or Firm*—J. T. Cavender; Edward Dugas; Stephen F. Jewett

[57] ABSTRACT

A random number generator that provides bits at its output that are neither biased nor periodic. The generator includes a noise generator and sampling register that provide serial, randomly varying bits. A circuit within the generator for reducing auto-correlation or periodicity discards certain ones of the randomly varying bits, and includes a first shift register for receiving and storing the randomly varying bits and a second register for receiving in parallel and storing only a portion of the randomly varying bits from the first register. In order to eliminate bias, EXCLUSIVE OR gates are connected between the first and second registers in order to logically combine the randomly varying bits received by the second register with previous bits stored in the second register.

9 Claims, 1 Drawing Figure

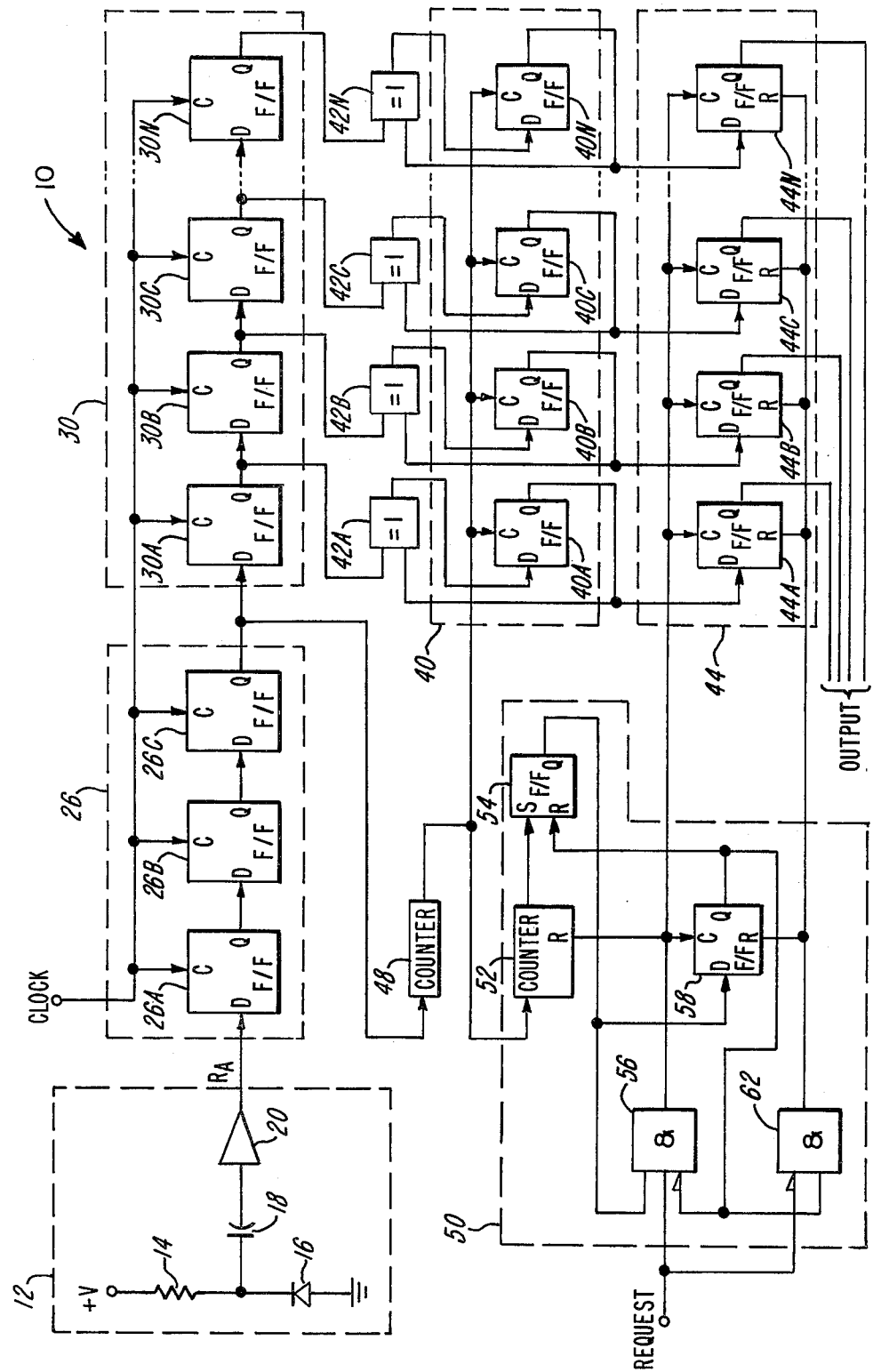

CIRCUITRY FOR MINIMIZING AUTO-CORRELATION AND BIAS IN A RANDOM NUMBER GENERATOR

BACKGROUND OF THE INVENTION

The present invention relates to random number generators and, more particularly, to a random number generator for generating true random binary numbers or bits.

Random number generators are useful in data processing equipment in a number of different ways. For example, a random number generator can be used to generate keys for encrypting data transmitted over a transmission line, so that unauthorized tapping of the transmission line will not yield an understandable message.

One problem encountered in the past with random number generators is that it is very difficult to obtain a sequence of true (or nearly true) random numbers. That is, the numbers generated at the output of a random number generator are frequently either (1) biased or (2) auto-correlated. By "biased", it is meant that there is greater than a fifty percent chance that each bit will be only one of the two binary values. By "auto-correlated", it is meant that the generated numbers tend to be periodic or cyclical.

Number generators generating numbers that appear random but that are actually periodic are sometimes referred to as pseudo-random number generators and, in many circumstances, are acceptable. However, in many other circumstances, such as in the generation of keys for data encryption, a non-periodic or "true" random sequence would be preferable.

SUMMARY OF THE INVENTION

There is provided, in accordance with the present invention, a true random number generator that generates random binary numbers or bits that are neither biased nor auto-correlated.

The random number generator includes a circuit for providing randomly varying bits and a circuit for minimizing or eliminating the auto-correlation or periodicity of the randomly varying bits by discarding certain ones of the bits. In addition, a circuit is provided for minimizing or elementing biasing of the randomly varying bits by logically combining the randomly varying bits with previous ones of the randomly varying bits.

In the preferred embodiment, the circuit for discarding certain ones of the bits includes a first shift register or storage means for serially receiving the randomly varying bits and a second register or storage means for receiving in parallel only a portion of the bits serially received by the first shift register. The portion of the bits received by the second register are a predetermined number equal to the number of bits provided in parallel at the output of the random number generator. The first and the second registers are clocked so that the first shift register receives a number of bits in excess of the predetermined number, and the excess bits are discarded before the portion or predetermined number are received by the second register.

The circuit for minimizing biasing of the randomly varying bits includes EXCLUSIVE OR logic gates connected between the first and second shift registers for logically combining the bits passed from the first register to the second register with the bits previously stored in the second register.

In the described preferred embodiment, the random number generator includes a noise generator and a sampling register that samples the output of the noise generator in order to provide the randomly varying bits. The output of the sampling register is serially provided to a first shift register that has the same number of stages as the output of the random number generator. The output of each stage of the first shift register is connected to one input of an associated EXCLUSIVE OR gate. The output of each EXCLUSIVE OR gate is connected to an associated stage of a second register that also has the same number of stages as the output of the random number generator. The output of each stage in the second register is connected to an associated stage of an output register and to a second input of its associated EXCLUSIVE OR gate.

The first shift register is controlled or clocked with the same clock signal as the sampling register. The second register is clocked by means for controlling or clocking that includes a first counter. The first counter counts logic level one bits from the sampling register and enables or clocks the second register to receive the bits from the first register only after a predetermined number of logic level one bits have been counted. As a result, the second register receives and stores only a portion of the bits received and stored by the first register. The output register is clocked by a circuit that includes a second counter so that the output register only receives the bits from the second register after repeated EXCLUSIVE ORing of the bits passed from the first register to the second register.

It is, therefore, an object of the present invention to provide an improved random number generator.

It is another object of the present invention to provide a random number generator of the numbers at the output wherein the biasing and auto-correlation can be reduced to any practical extent desired.

Still another object of the present invention is to provide a true random number generator that is both simple in design and inexpensive to manufacture.

These and other objects of the present invention will become more apparent when taken in conjunction with the following description and the attached drawings.

BRIEF DESCRIPTION OF THE DRAWING

The FIGURE in the drawings is a block diagram showing a random number generator in accordance with the present invention.

DETAILED DESCRIPTION OF THE PREFERRED EMBODIMENT

Referring now to the drawings, there is shown a random number generator 10 in accordance with the present invention. The random number generator 10 generates random bits at its output in response to a randomly varying noise signal $R_A$ produced by a noise generator 12.

The noise generator 12 is constructed in a conventional fashion and includes a resistor 14, a diode 16, a capacitor 18, and an amplifier 20. A reverse voltage $+V$ is applied across the resistor 14 and diode 16, causing the diode 16 to operate in its avalanche region and produce current having a randomly varying component or signal. The randomly varying component of the current from the diode 16 is passed through capacitor 18 and amplified by the amplifier 20 to provide the signal $R_A$.

The randomly varying signal $R_A$ at the output of the noise generator 12 is periodically sampled by a sampling register 26 that includes three flip-flops 26A, 26B and 26C. The flip-flops 26A, 26B and 26C are clocked by a clocking signal CLOCK, which determines the frequency with which the random signal $R_A$ is sampled. A suitable frequency for the signal CLOCK is ten microseconds, which will provide random bits at the output of the random number generator 10 at a frequency appropriate for data encryption. The output of the sampling register 26 is successive or serial randomly varying binary bits, each bit at either a logic level "0" or a logic level "1".

In the actual practice of the present invention, any number of flip-flops can be used to provide the sampling register 26. While in many circumstances only a single flip-flop would be necessary, the provision of plural flip-flops, such as the three illustrated flip-flops 26A, 26B and 26C, minimizes the possibility of undefined states appearing at the output of the sampling register 26. That is, as the randomly varying signal $R_A$ varies between its minimum and maximum values, it may occasionally be sampled at a value which falls between the voltage ranges which represent the two binary values, so that the output of flip-flop 26A goes to an undefined state. The signal at the output of flip-flop 26A is successively sampled by flip-flops 26B and 26C in order to reduce the likelihood that the signal at the output of the sampling register will remain in this undefined state.

As those skilled in the art will appreciate, the signal $R_A$ generated by the noise generator 12 and, consequently, the bits at the output of the sampling register 26, will normally have some degree of both biasing and auto-correlation.

In accordance with the present invention, and as will be more fully described later, the output of the sampling register 26 is provided to circuitry that discards certain ones of the randomly varying bits in order to minimize auto-correlation. In the random number generator 10, the circuitry for discarding the bits includes a first shift register 30 and a second register 40. The register 30 has a plurality of stages or flip-flops 30A through 30N, each paired with or connected to an associated one of a plurality of stages or flip-flops 40A through 40N in register 40.

In addition, the random number generator 10 has circuitry for minimizing biasing of the randomly varying bits, such circuitry including a plurality of EXCLUSIVE OR gates 42A through 42N that are associated with and connected between the associated pairs of flip-flops in the registers 30 and 40.

The number of stages in the registers 30 and 40 and the number of EXCLUSIVE OR gates 42A through 42N are the same and are equal to the number of bits provided in parallel at the output of the random number generator 10. For example, if a 32-bit random number is provided at the output, then there would be thirty-two stages in registers 30 and 40 and thirty-two EXCLUSIVE OR gates connected therebetween.

The registers 30 and 40 are clocked so that a random portion of the bits that are serially received by the register 30 are discarded and are not transferred from the register 30 to the register 40. This is accomplished, in accordance with one aspect of the present invention, by clocking the flip-flops 30A through 30N with the same signal CLOCK that is used to clock the flip-flops 26A through 26C in sampling register 26. The flip-flops 40A through 40N in register 40, however, are clocked by a circuit in the form of a counter 48 which is incremented by the output of the sampling register 26. Counter 48 will provide an enabling clock signal to the registers 40A through 40N only when it receives a predetermined number of logic level "1" bits from the output of sampling register 26.

In the preferred embodiment illustrated in the drawings, the counter 48 is a 5-bit counter, with the counter 48 only providing an enabling clock signal when it receives thirty-two logic level "1" from the sampling register 26. Since there will be a fairly even distribution of "1's" and "0's" at the output of sampling register 26, even with some inherent biasing, the register 40 is normally clocked only after a significant number of bits in excess of thirty-two have been serially received by the first stage 30A of register 30. These excess bits are discarded at the last stage 30N of register 30 and, when register 40 is clocked, only the remaining thirty-two bits in register 30 are transferred or passed in parallel to the register 40 by way of the EXCLUSIVE OR gates 42A through 42N.

It should be apparent, of course, to one skilled in the art that the manner in which the registers 30 and 40 are clocked in order to discard certain ones of the bits could be done other than as shown in the drawings. However, the use of the counter 48, connected as shown, is preferred since in any given sequence of bits provided by the sampling register 26 the number of "1's" will vary and will more effectively randomize the occurrence of the enabling clock signal provided at the output of counter 48. The more random the enabling clock signal, the less likely it is that the output of the random number generator will have any repetitive characteristics. In addition, the larger the count of the counter 48, the more complete the elimination of auto-correlation at the output of the random number generator.

As mentioned above, the EXCLUSIVE OR gates 42A through 42N minimize the inherent bias that exists in the randomly varying bits that are provided at the output of the sampling register 26 and that are passed by the register 30 to the register 40. The EXCLUSIVE OR gates 42A through 42N each have one input connected to its associated stage in the register 30 and its output connected to the input of its associated stage in the register 40. The output of its associated stage in the register 40 is connected back to the second input of the EXCLUSIVE OR gate. In addition, the output of each stage in the register 40 is connected to an associated one of a plurality of stages 44A through 44N of an output register 44. The outputs of the stages in the register 44 provide, in parallel, the output of the random number generator 10.

The output register 44 is clocked by a clocking circuit, designated 50, that provides an enabling clocking signal when the random number generator 10 is requested to provide a random number at its output. In order to further randomize the bits in the number generated by the random number generator 10 and, in particular, to more completely reduce the bias of the bits at the output of the random number generator 10, a second counter 52 is provided in the clocking circuit 50.

In the preferred embodiment, the counter 52 is, for example, a 4-bit counter. The counter 52 counts the enabling clock signals at the output of the counter 48 so that bits from the register 30 are repeatedly EXCLUSIVE ORed at the EXCLUSIVE OR gates 42A through 42N and stored in the register 40, before being passed to the output register 44. The output of the counter 52 is connected to the SET input of an SR flip-flop 54 that is in turned connected at its output to one input of AND gate 56 and to the data input of a flip-flop 58. A second input of the AND gate 56 is connected for receiving a signal REQUEST, which is received from an external souce and is at a "1" when a random number is desired from the output of the random number generator 10. The output of the flip-flop 58 is normally at a "0" and is connected to the third input of the AND gate 56.

When the counter 52 reaches its full count, the flip-flop 54 is set and goes to a "1". When the signal REQUEST goes to a "1", the AND gate 56 provides an enabling clock signal to the flip-flops 44A through 44N in register 44 in order to provide the bits of a random number to the output of the random number generator 10. In addition, the output of AND gate 56 resets counter 52 and, at the same time, clocks the flip-flop 58 so that, momentarily later, the "1" at the output of SR flip-flop 54 is stored in flip-flop 58. The "1" in flip-flop 58 is provided back to AND gate 56, to end the clock signal at its output.

The output of the flip-flop 58 is also connected to one input of an AND gate 62, whose output is connected to the reset input of the flip-flops 44A through 44N in the register 44. The second input of the AND gate 62 is connected for receiving the REQUEST signal, so that when the request ends and REQUEST goes to a "0", the output of AND gate 62 goes to a "1" in order to reset the flip-flops in the register 44.

It should be apparent from the foregoing that the random number generator 10 provides bits at its output that are neither biased nor periodic. As described above, by clocking the registers 30 and 40 so that bits in excess of the predetermined number needed for the output are shifted into register 30, and so that the excess bits are discarded before being passed to register 40, the inherent repetitiveness or auto-correlation of the randomly varying bits provided by the sampling register 26 is minimized. In addition, by causing the bits being passed from register 30 to register 40 to also be EXCLUSIVE ORed with bits previously stored in register 40, and by also clocking the register 44 so that the EXCLUSIVE ORing is repeated, the inherent biasing of the randomly varying bits is minimized.

Although the presently preferred embodiment of this invention has been described, it will be understood that within the purview of this invention various changes may be made within the scope of the appended claims.

I claim:

1. A random number generator having an output for providing random numbers, comprising:
   means for providing successive and randomly varying bits; and
   means for receiving the randomly varying bits and minimizing auto-correlation in the randomly varying bits, including means for discarding certain ones of the randomly varying bits so that random numbers provided at the output of said random number generator do not include the discarded bits, said means for discarding comprising:
   a first shift register clocked by a first clock signal in order to serially receive and store the randomly varying bits; and
   a second register connected to said first shift register in order to receive in parallel the bits stored by said first register, said second register clocked by a signal other than the first clock signal so that said second register receives and stores only a portion of the bits received by said first register, with said second register providing the portion of the bits to the output of said random number generator.

2. The random number generator of claim 1, further comprising circuit means for minimizing bias in the randomly varying bits, including logic gate means having first input means connected for receiving the bits stored in said first register, second input means connected for receiving the bits stored in said second register, and output means connected for providing bits to said second register, said logic gate means logically combining the bits at said first input means and said second input means and providing the logically combined bits at said output means, so that the portion of the bits received by said second register from said first register are logically combined with the portion of the bis previously received by said second register before being received and stored in said second register.

3. In a random number generator, a circuit for minimizing auto-correlation in successive random bits, comprising:
   first storage means for being clocked to serially receive the bits and to store a predetermined number of the bits, said first storage means having a plurality of stages, including a first stage and a last stage, each stage for storing one of the bits, with said first storage means discarding the one of the bits in the last stage when one of the bits is received in the first stage;
   second storage means for storing the same predetermined number of bits and connected for receiving in parallel the bits stored in said first storage means; and
   means connected to said second storage means for clocking said second storage means to receive the bits from said first storage means only after a number in excess of the predetermined number of bits have been serially received in said first storage means and at least one of the bits has been discarded in said first storage means.

4. The circuit of claim 3, wherein said first storage means comprises a first shift register and said second storage means comprises a second register, said first and second registers both having a plurality of stages.

5. The circuit of claim 4, wherein said means for clocking said second storage means comprises a first binary counter having an input connected for receiving the successive random bits, said first counter incremented by bits having one predetermined binary value, said first counter having an output connected for providing an enabling clock signal to said second register.

6. The circuit of claim 5, further comprising logic gate means connecting each stage of said first register to an associated stage in said second register, said logic gate means having one input connected to the output of one of the stages of said first register, having its output connected to the data input of the associated stage of said second register, and having its second input connected to the output of said second register, so that each bit received by said second register from said first register is logically combined with a previous bit stored in said second register.

7. The circuit of claim 6, further comprising a third register having a plurality of stages, each stage connected for receiving the bit stored in an associated one of the stages in said second register, and clocking circuitry for providing an enabling clocking signal to said third register so that the stages of said third register receive bits from said second register, with the bits stored in said second register repeatedly provided to and logically combined at said logic gate means prior to being received by said third register.

8. The circuit of claim 7, wherein said clocking circuitry includes a second counter having its input connected to the output of said first counter.

9. In a random number generator, a circuit for receiving randomly varying bits of a random number and reducing the bias of the randomly varying bits, the circuit comprising:

a plurality of EXCLUSIVE OR gates, each of said EXCLUSIVE OR gates having first and second inputs, and an output, with the first input for receiving one of the randomly varying bits; and a register for storing the randomly varying bits from said EXCLUSIVE OR gates and having a plurality of stages, each stage associated with one of said EXCLUSIVE OR gates and having an input connected to the output of its associated EXCLUSIVE OR gate and an output connected to the second input of its associated EXCLUSIVE OR gate, so that the randomly varying bits are logically combined at said EXCLUSIVE OR gates with previous randomly varying bits stored in said register.

* * * * *